US007671702B2

(12) United States Patent
Afshari et al.

(10) Patent No.: US 7,671,702 B2
(45) **Date of Patent: *Mar. 2, 2010**

(54) 2D TRANSMISSION LINE-BASED APPARATUS AND METHOD

(75) Inventors: Ehsan Afshari, Pasadena, CA (US); Harish Bhat, Union City, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/252,713

(22) Filed: Oct. 16, 2008

(65) Prior Publication Data

US 2009/0096554 A1 Apr. 16, 2009

Related U.S. Application Data

(63) Continuation of application No. 11/413,613, filed on Apr. 28, 2006, now Pat. No. 7,456,704.

(60) Provisional application No. 60/676,430, filed on Apr. 29, 2005.

(51) Int. Cl.
*H03H 5/12* (2006.01)
*H03H 7/38* (2006.01)

(52) U.S. Cl. ....................... 333/124; 333/125; 333/127; 333/128; 333/136

(58) Field of Classification Search ................. 333/124, 333/125, 127, 128, 136
See application file for complete search history.

(56) References Cited

U.S. PATENT DOCUMENTS

| | | | | |
|---|---|---|---|---|
| 3,939,441 A * | 2/1976 | Menzel et al. | .............. | 333/167 |
| 5,485,118 A * | 1/1996 | Chick | .......................... | 330/52 |
| 5,566,083 A * | 10/1996 | Fang | ............................ | 703/4 |
| 6,557,154 B1 * | 4/2003 | Harada et al. | ................. | 716/11 |

* cited by examiner

*Primary Examiner*—Robert Pascal
*Assistant Examiner*—Kimberly E Glenn
(74) *Attorney, Agent, or Firm*—Steinfl & Bruno

(57) ABSTRACT

A power combiner comprising an LC lattice structure is shown, together with a method for generating a planar wave front. The LC structure can comprise constant or voltage dependent capacitors. Either the delay or the characteristic impedance of the two-dimensional transmission line formed by the LC lattice structure are kept constant. A planar wave propagating along one direction of the transmission line gradually experiences higher impedances at the edges, creating a lower resistance path for the current in the middle. This funnels more power to the center as the wave propagates.

5 Claims, 19 Drawing Sheets

FIG. 23A
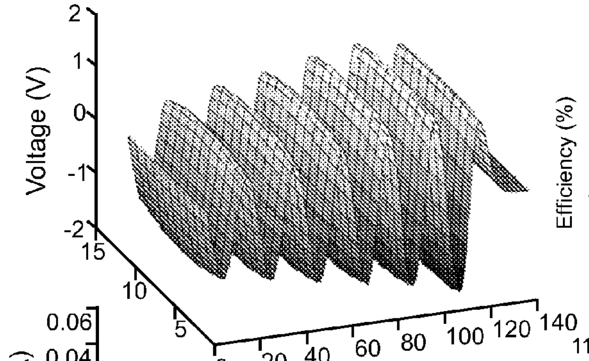
FIG. 23B
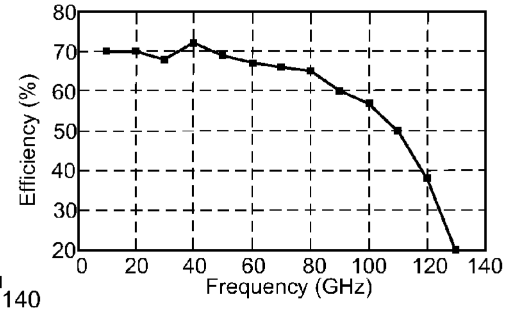
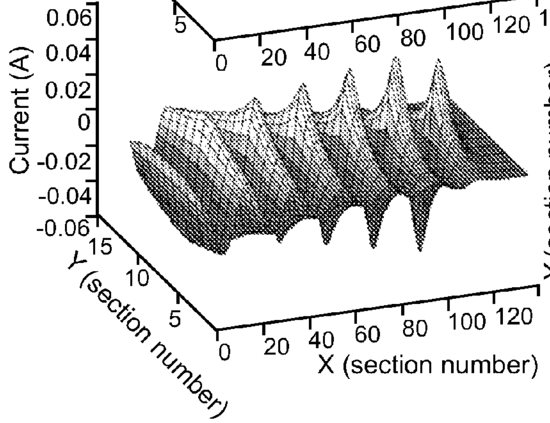
FIG. 23C
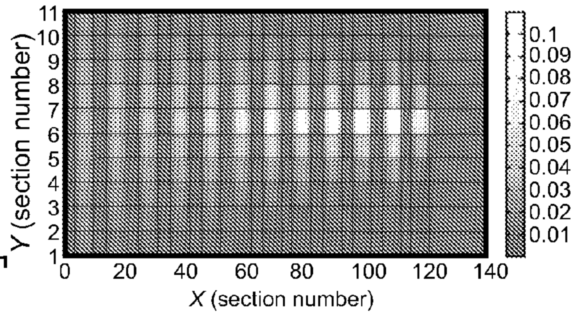
FIG. 23D
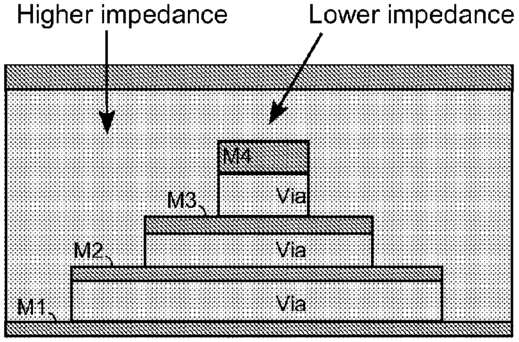
FIG. 24A
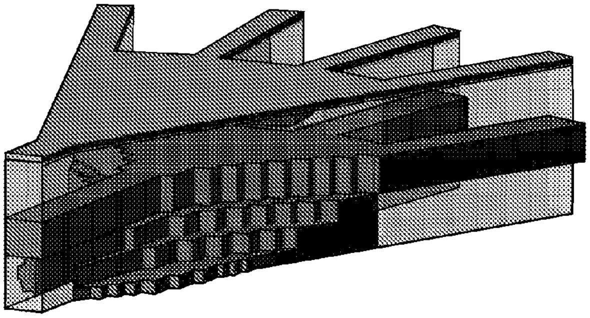
FIG. 24B

2D TRANSMISSION LINE-BASED APPARATUS AND METHOD

CROSS REFERENCE TO RELATED APPLICATIONS

The present application is a continuation of U.S. Ser. No. 11/413,613 filed on Apr. 28, 2006 which, now U.S. Pat. No. 7,456,704 in turn, claims priority to U.S. provisional application 60/676,430 filed on Apr. 29, 2005, both of which are incorporated herein by reference in their entirety.

BACKGROUND

1. Field

The present disclosure is directed to transmission lines, and in particular on an apparatus and method based on a two-dimensional transmission line.

2. Related Art

It is always difficult to generate broadband signals with more bandwidth and/or quasi-single tone signals at higher frequencies due to the frequency limitations of passives and active devices. For example, in an integrated circuit process, the maximum frequency of operation for transistor is often limited by $f_T$ and $f_{max}$ of the transistors. In fact, $f_T$ and $f_{max}$ are maximum theoretical limits when the transistors current and power gains drop to unity, respectively. The transistor is hardly useful at such frequencies and therefore, to perform any kind of meaningful operation, be it analog amplification or digital switching, the circuits can only operate with bandwidths and frequencies that are only a small fraction of these limits (i.e., $f_T$ and $f_{max}$).

However, it is highly desirable to be able to generate extremely broadband signals with reasonable power for many applications, including (but not limited to) ultra-wideband impulse radio, ultra-wideband RADAR, and timing generation. At same time efficient generation of large amounts of RF power at higher frequencies has been the Holy Grail of microwave and RF designers.

Recently, there has been growing interest in using silicon-based integrated circuits at high microwave and millimeter wave frequencies. The high level of integration offered by silicon enables numerous new topologies and architectures for low-cost reliable SoC applications at microwave and millimeter wave bands, such as broadband wireless access (e.g., WiMax), vehicular radars at 24 GHz and 77 GHz [20], short range communications at 24 GHz and 60 GHz, and ultra narrow pulse generation for UWB radar.

Power generation and amplification is one of the major challenges at millimeter wave frequencies. This is particularly critical in silicon integrated circuits due to the limited transistor gain, efficiency, and breakdown on the active side and lower quality factor of the passive components due to ohmic and substrate losses.

Efficient power combining is particularly useful in silicon where a large number of smaller power sources and/or amplifiers can generate large output power levels reliably. This would be most beneficial if the power combining function is merged with impedance transformation that will allow individual transistors to drive more current at lower voltage swings to avoid breakdown issues [21]. Most of the traditional power combining methods use either resonant circuits and are hence narrowband or employ broadband, yet lossy, resistive networks.

The concept of a solitary wave was introduced to science by John Scott Russell 170 years ago [1]. In 1834 he observed a wave which was formed when a rapidly drawn boat came to a sudden stop in narrow channel. According to his diary, this wave continued "at great velocity, assuming the form of a large solitary elevation, a well-defined heap of water that continued its course along the channel apparently without change of form or diminution of speed". These solitary waves, now called 'solitons', have become important subjects of research in diverse fields of physics and engineering. There is a considerable body of work on solitons in applied mathematics (e.g., [2, 3]), applied physics—especially in optics (e.g. [4-7])—and few works in electronics [8]. The ability of solitons to propagate with small dispersion can be used as an effective means to transmit data, modulated as short pulses over long distances; one example of this is the ultra wideband impulse radio that has recently gained popularity [16].

An important related application is pulse sharpening for the more traditional non-return-to-zero (NRZ) data transmission in digital circuits by improving the edges of the pulses. Improving the transitions by shrinking the rise and fall times of pulses can be useful in other applications, such as high-speed sampling and timing systems. Non-linear transmission lines' (NLTLs) sharpening of either the rising or falling edge of a pulse has been demonstrated on a GaAs technology [9], [10]. However, to the best of applicants' knowledge, to this date there has been no demonstration of simultaneous reduction of both rise and fall times in an NLTL. Neither are the applicants aware of any demonstration of such NLTLs in silicon-based CMOS process technologies.

SUMMARY

According to a first aspect, a power combiner is provided, comprising: a first plurality of segments serially distributed along a first direction; a second plurality of segments serially distributed along a second direction; and a plurality of nodes formed by intersection of the first plurality of segments with the second plurality of segments, each node associated with a series inductance of the first plurality of segments, a series inductance of the second plurality of segments and a capacitance, wherein the first and second plurality of segments form a transmission line having a propagration velocity and a characteristic impedance, and wherein one between the propagation velocity and the characteristic impedance is constant and the other between the propagation velocity and the characteristic impedance is variable.

According to a second aspect, a method for generating a planar wave front, comprising: providing two-dimensional transmission line comprising inductors and capacitors, said transmission line having a delay and a characteristic impedance; keeping constant one between the delay and the characteristic impedance and varying the other between the delay and the characteristic impedance; and inputting a plurality of signal sources to the transmission line.

In this application, the applicants propose novel techniques for generation of ultra-sharp pulses and high power high frequency signal sources. The proposed application relies on using linear and nonlinear power combining and generation techniques.

In particular, the applicants propose a general class of two-dimensional passive propagation media that can be used for power combining and impedance transformation among other things. These media take advantage of wave propagation in an inhomogeneous 2-D electrical lattice. Using this approach the applicants show a power amplifier capable of generating 125 mW at 85 GHz in silicon.

BRIEF DESCRIPTION OF THE DRAWINGS

FIGS. 19A and 19B show input and output waveforms of an edge sharpening line.

FIGS. 23A-23D show simulation results of an ideal funnel with 30 pH<L<150 pH and 30 fF<C<300 fF.

FIGS. 24A and 24B show a combiner structure.

A list of references cited [1]-[22] is present at the end of the specification section and before the claims section. Are references [1]-[22] are herein incorporated by reference in their entirety.

DETAILED DESCRIPTION

The Theory of Non-Linear Transmission Line

Figure 1:
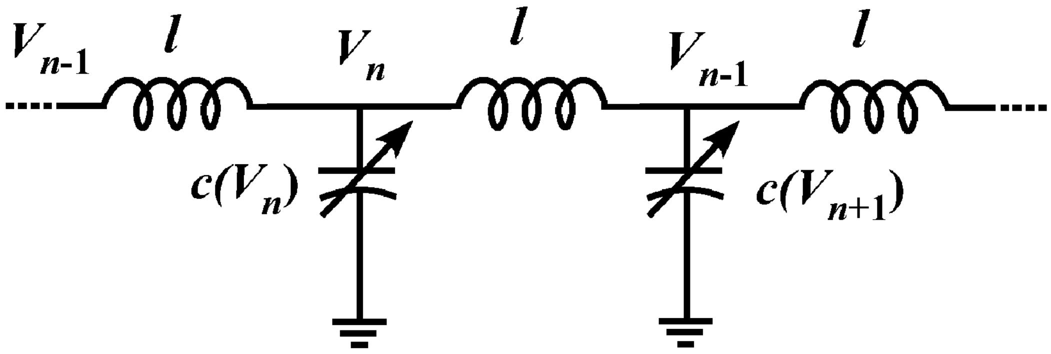
FIG. 1 shows a nonlinear transmission line.

In this section the applicants review the basic theory behind non-linear transmission lines and their use for pulse narrowing and edge sharpening in subsections A and B, respectively. FIG. 1 shows an example of a non-linear transmission line using inductors, l, and voltage dependent (hence non-linear) capacitors, c(V).

By applying Kirchoff's Current Law (KCL) at node n, whose voltage with respect to ground is $V_n$, and applying Kirchoff's Voltage Law (KVL) across the two inductors connected to this node, as shown in [15], one can easily show that voltages of the adjacent nodes on this NLTL are related via:

$$l\frac{d}{dt}\left[c(V_n)\frac{dV_n}{dt}\right] = V_{n+1} + V_{n-1} - 2V_n \tag{1}$$

The right-hand side of (1) can be approximated with partial derivatives with respect to distance, x, from the beginning of the line, assuming that the spacing between two adjacent sections is δ (i.e., $x_n$=nδ.) An approximate continuous partial differential equation can be obtained by using the Taylor expansions of V(x−δ), V(x), and V(x+δ) to evaluate the right hand side of (1). i.e., $$l\frac{\partial}{\partial t}\left[c(V)\frac{\partial V}{\partial t}\right] = \delta^2\frac{\partial^2 V}{\partial x^2} + \frac{1}{12}\delta^4\frac{\partial^4 V}{\partial x^4} \tag{2}$$

Defining $$L = \frac{l}{\delta} \text{ and } C(V) = \frac{c(V)}{\delta}$$

as the inductance and capacitance per unit length respectively, (2) can be written as:

$$L\frac{\partial}{\partial t}\left[C(V)\frac{\partial V}{\partial t}\right] = \frac{\partial^2 V}{\partial x^2} + \frac{\delta^2}{12}\frac{\partial^4 V}{\partial x^4} \tag{3}$$

It is noteworthy that for a continuous transmission line (δ→0), (3) reduces to:

$$L\frac{\partial}{\partial t}\left[C(V)\frac{\partial V}{\partial t}\right] = \frac{\partial^2 V}{\partial x^2} \tag{4}$$

In a linear transmission line when, C(V)=C=const., equation (4) can be written as:

$$\frac{\partial^2 V}{\partial t^2} - \frac{1}{LC}\frac{\partial^2 V}{\partial x^2} = 0 \tag{5}$$

A. Pulse Narrowing Non-Linear Transmission Lines

In this sub-section, the capacitor's voltage dependence is approximated using the following first-order linear approximation:

$$C(V)=C_0(1-bV) \tag{6}$$

where $C_0$ and b are constants. In this case, (3) reduces to:

$$\frac{\partial^2 V}{\partial t^2} - \frac{1}{LC_o}\frac{\partial^2 V}{\partial x^2} = \frac{\delta^2}{12}\frac{1}{LC_o}\frac{\partial^4 V}{\partial x^4} + \frac{b}{2}\frac{\partial^2 (V^2)}{\partial t^2} \tag{7}$$

where the left-hand side is the classic wave equation, and the first and second terms on the right-hand side represent dispersion and non-linearity, respectively.

Figure 2:
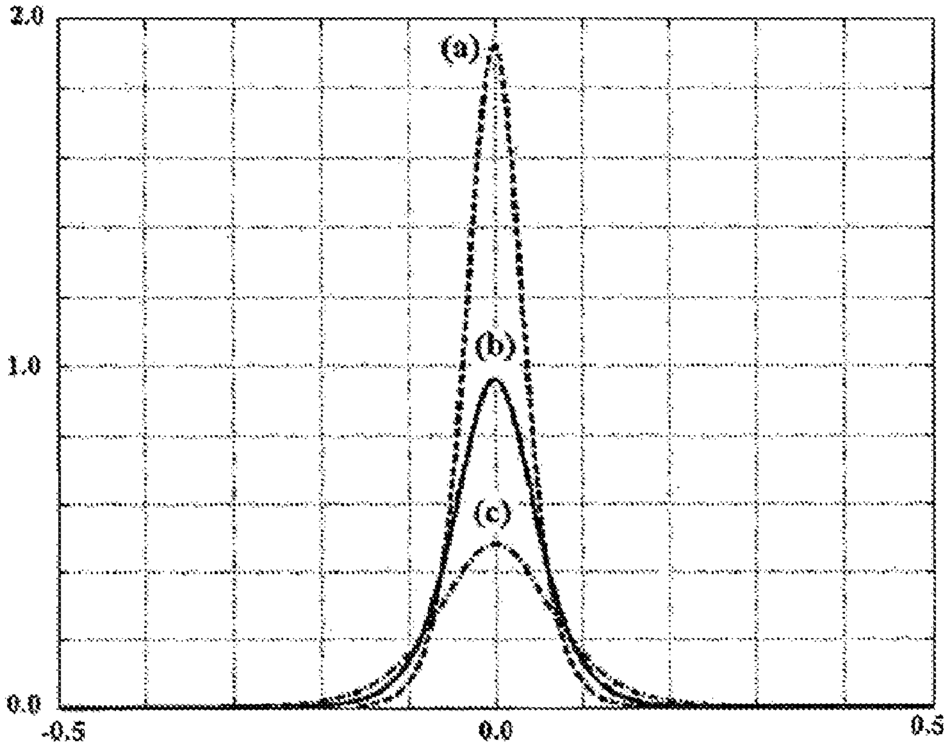
FIG. 2 shows three normalized soliton shapes for different values of L and C: (a) L=1 nH and C=1 nF; (b) L=2 nH and C=2 nF; (c) L=4 nH and C=4 nF.

If the effect of the dispersive and non-linear terms in (7) are on the same order of magnitude, it is possible to have a single pulse solution for (7) with a profile that does not change as it propagates with velocity, v. A propagating mode solution can be obtained by converting the partial differential equation (PDE) of (7) to an ordinary differential equation (ODE) by a simple change of variable, u=x−vt. The complete derivation can be found in [15]. This solution is:

$$V(x,t)=\frac{3(v^2-v_0^2)}{bv^2}\mathrm{sech}^2\left[\frac{\sqrt{3(v^2-v_0^2)}}{v_0}\frac{(x-vt)}{\delta}\right] \tag{8}$$

where v is the propagation velocity of the pulse and $v_0=1/\sqrt{LC_0}$. It can be proven mathematically that (8) is the only physically meaningful traveling wave solution to (7) that maintains its shape while propagating through NLTL. This solution is shown in FIG. 2 for three different values of L and C, and hence different δ. Note that this solution is not a function of the input waveform, and thus any arbitrary input will eventually turns into (8), if it goes through a line which is long enough.

As can be seen from (8), the peak amplitude is a function of the velocity. Defining an effective capacitance, $C_{eff}$, so that $v=1/\sqrt{LC_{eff}}$, the pulse height is given by:

$$V_{max}=\frac{3}{b}\cdot\frac{v^2-v_0^2}{v^2}=\frac{3}{b}\left(1-\frac{C_{eff}}{C_o}\right) \tag{9}$$

Using (9), $C_{eff}$ can be related to an effective voltage $V_{eff}$. It is straightforward to show that $$V_{eff}=\frac{V_{max}}{3} \tag{10}$$

So it is the capacitance at one-third the peak amplitude, that determines the effective propagation velocity. Using (8)-(10) the half-height width of the pulse can be easily calculated to be:

$$W\approx\frac{\delta}{v}\frac{v_0}{\sqrt{(v^2-v_0^2)}} \tag{11}$$

Figure 3:
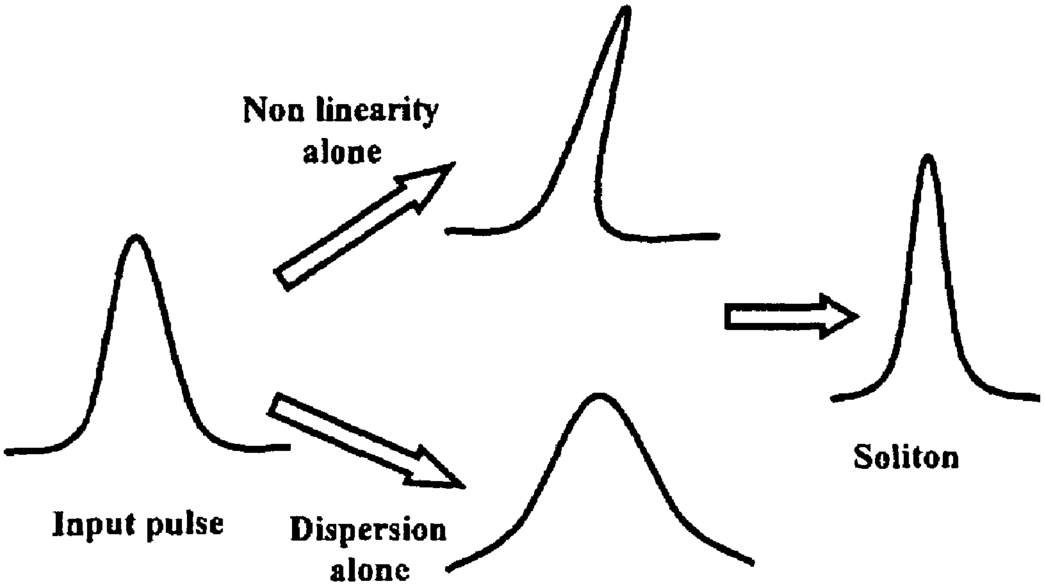
FIG. 3 shows dispersion and nonlinear effects in the NLTL.

As can be seen, in a weakly dispersive and non-linear transmission line, the non-linearity can counteract the normally present dispersive properties of the line maintaining solitary waves that propagate without dispersion. This behavior can be explained using the following intuitive argument. The instantaneous propagation velocity at any given point in time and space is given by $1/\sqrt{LC}$. In the presence of a non-linear capacitor with a characteristic given by (6), the instantaneous capacitance is smaller for higher voltages. Therefore, the points closer to the crest of the voltage waveform experience a faster propagation velocity and produce a shock-wave front, due to the nonlinearity, as shown symbolically in the upper part of FIG. 3. Note that this is not a real waveform and more a fictitious representation of how each point on the curve tends to evolve. On the other hand, dispersion of the line causes the waveform to spread out, as shown in the lower half of FIG. 3. For a proper non-linearity determined by (7), these two effects can cancel each other out.

A few important observations are: 1) the velocity of the solitary wave increases with its amplitude, 2) pulse width decreases with increasing pulse velocity, 3) the width shrinks for higher amplitudes, 4) the sign of solution depends on the sign of non-linearity factor, b, i.e. for a capacitor with a positive voltage dependence (e.g., an nMOS varactor in accumulation mode) we have:

$$C(V)=C_0(1+bV) \tag{12}$$

resulting in upsidedown pulses.

Based on these results, to achieve large-amplitude narrow pulses, inductance and capacitance of the NLTL must be as small as possible, and non-linearity factor, b, should be large enough to compensate the dispersion of the line.

It is also important to know the characteristic impedance of these lines (for impedance matching, etc.). As in a NLTL the capacitance is a function of voltage, we can only define an effective semi-empirical value for the characteristic impedance. Simulation results indicate that one can approximate $Z_{eff}$ using the capacitance at $V_{eff}$ defined in (13), i.e.:

$$z_{eff}=\sqrt{\frac{L}{C(V_{max}/3)}} \tag{13}$$

B. Edge Sharpening Lines

It is possible to design NLTLs to sharpen the pulse transitions. This is particularly useful for digital transmission such as non-return to zero (NRZ) data. Unfortunately, all the efforts in the past [9,10] have resulted in sharpening of only one of the rising and falling edges. This, however, has very little practical value, as both transitions are equally important in common NRZ digital systems. This problem can be traced back to the monotonic dependence of the non-linear capacitive elements used in NLTL on the voltage (e.g., reverse biased PN junction, or the ideal behavior of (6) and (12)).

Fortunately, CMOS processes offer different characteristics for non-linear capacitors that can be exploited to achieve simultaneous edge sharpening for both rising and falling edges. More specifically, accumulation mode MOS varactors [11] (an nMOS capacitor in an n-well) offer non-monotonic voltage dependence. Particularly, the secondary reduction of capacitance shown in FIG. 4 due to poly-silicon depletion [12, 13] and short-channel charge quantization [13] effects can be used for edge sharpening.

Figure 4:
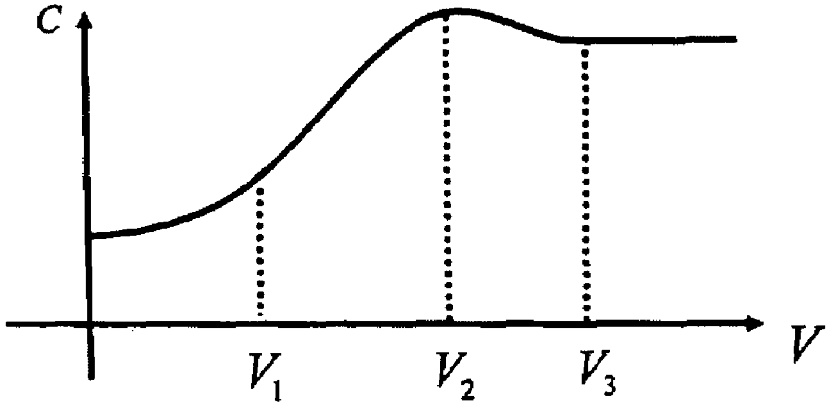
FIG. 4 shows a capacitance vs. voltage diagram for a MOSVAR.
Figure 5:
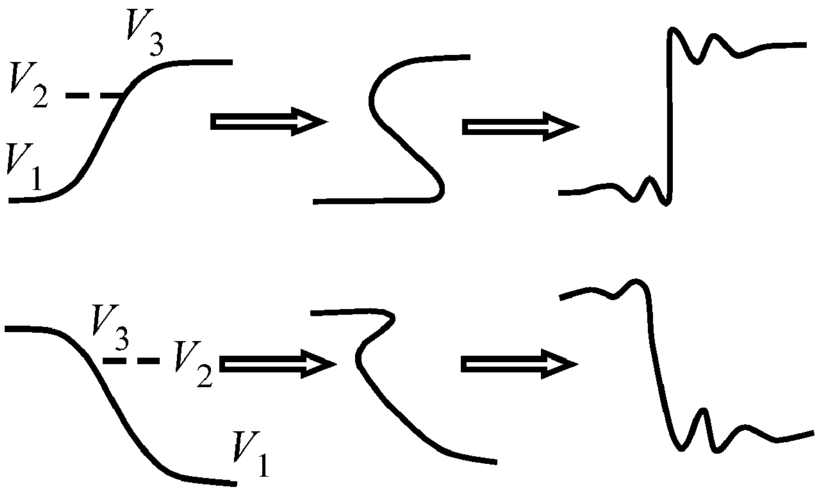
FIG. 5 shows how rise and fall time vary within the NLTL.
Figure 11:
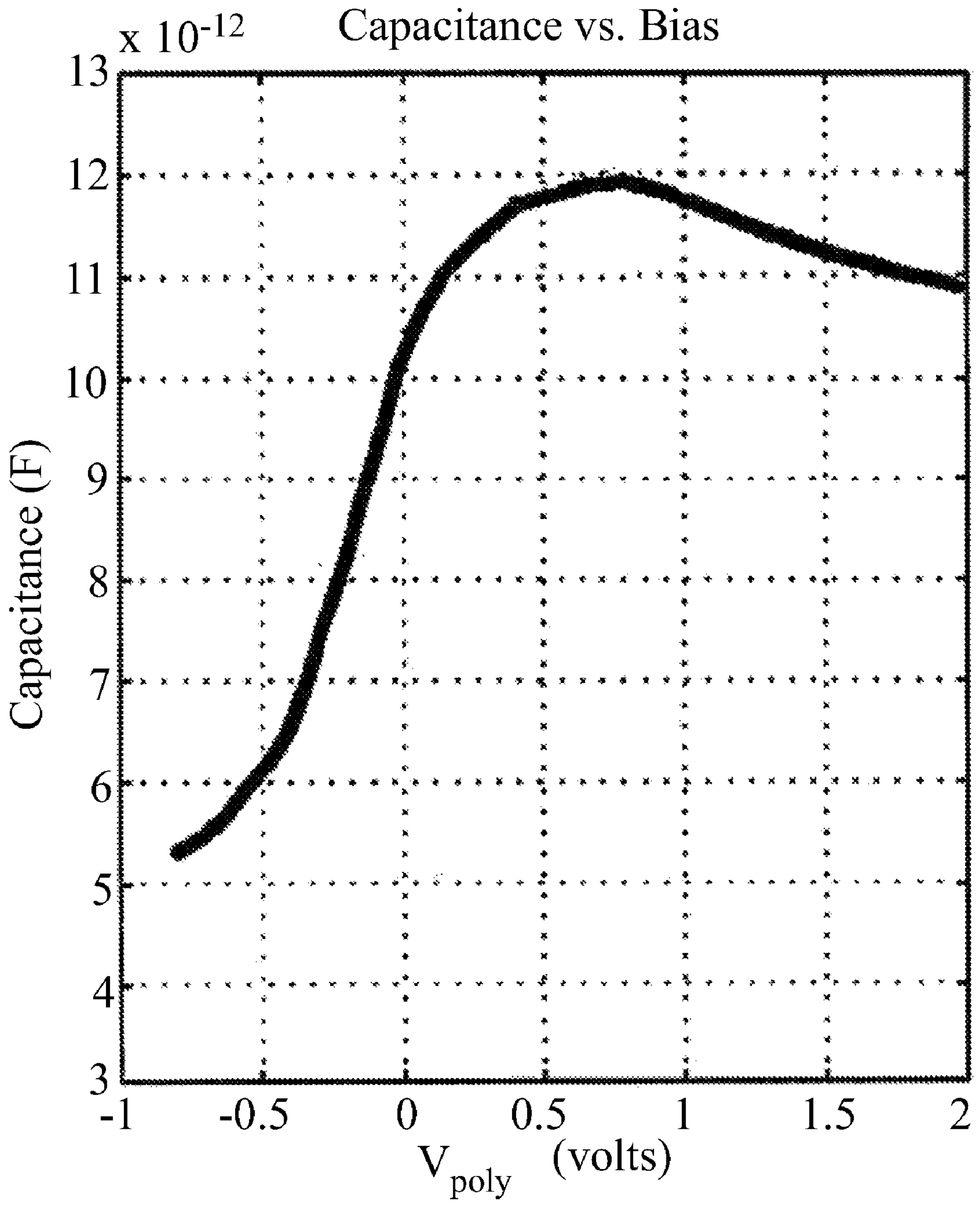
FIG. 11 shows a measured characteristic of MOSVAR.

FIG. 5 shows symbolically how one can use the behavior of FIG. 4 to sharpen both edges. First, let us focus on the rise-time reduction. Consider the rising edge shown in the upper part of FIG. 5. Initially the voltage is low, which corresponds to a smaller capacitance per FIG. 4, and hence a faster instantaneous propagation velocity for the lower end of the pulse. As the voltage goes up, the capacitance increases, resulting in a decrease in the instantaneous propagation velocity. This pushes the lower end of the transition forward in time and results in sharpening of the rising edge. This effect is symbolically shown in the fictitious middle waveform of FIG. 5. The fall time reduction can be explained using the lower part of FIG. 5. This is where the non-monotonic behavior of FIG. 4 plays its role. The upper part of the transition (voltages above $V_2$) will be accelerated due to the reduction of the capacitance and will create an advancing front, as symbolically shown in the middle waveform of FIG. 5. The lower capacitance at the very low voltages can generate a leading tail, which will be partially dissipated by the line. The weak reduction in capacitance from $V_2$ to $V_3$ versus reduction from $V_1$ to $V_2$ results in mismatched rise/fall time as can be seen in FIG. 5 and FIG. 11.

While the above explanation based on a simplified memory-less description of the line provides a basic intuition for its operation, a complete description can only be obtained by solving the differential equation in (3) to account for the memory of the system. The applicants hypothesize that other dynamic effects in the MOS varactor may also help edge sharpening, e.g., the processes of charge being attracted from the n+ diffusions to the channel and repelling them are not exact inverses of each other over short time intervals. Some of the repelled accumulation charges will be absorbed inside the well. This changes the response time of the capacitor and keeps it higher for a longer period of time for the falling edge. The numerical solution of (6) also confirms that as long as the input voltage range exceeds voltages, $V_1$ and $V_3$, for a range of L's and C's, the line sharpens both rising and falling edges, simultaneously.

It may also be possible to achieve a symmetrical wave form by:

A. Using an n-type and a p-type MOSVAR in parallel to create a symmetrical C(V) curve. The problem of this method is that a p-type MOSVAR is not as fast as n-type MOSVAR therefore the frequency response of the line would be limited to the frequency response of the p-type MOSVARs.

Figure 6:
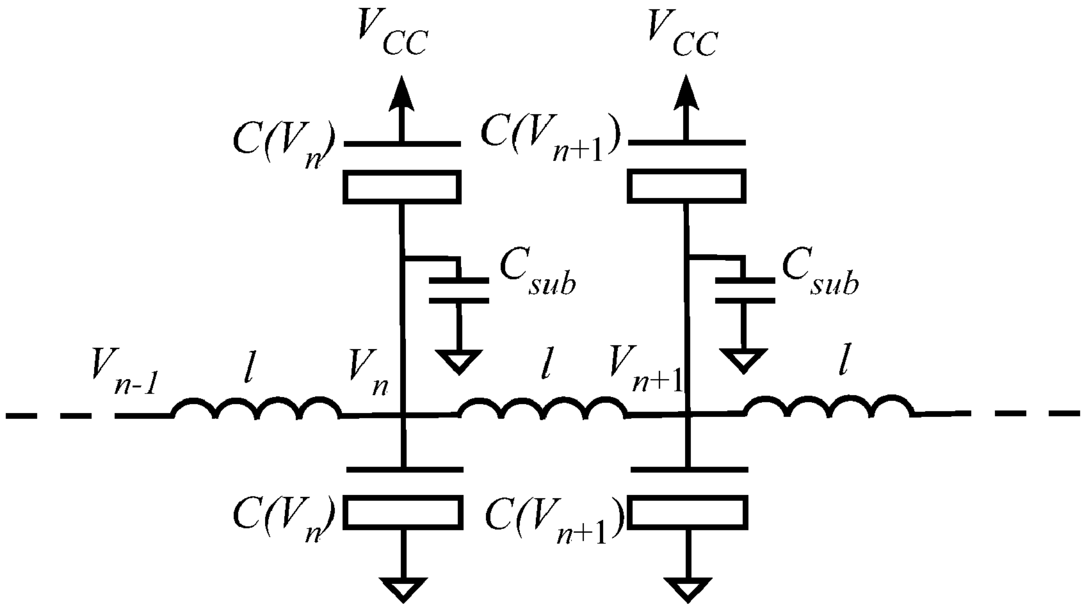
FIG. 6 shows an exemplary NLTL for simmetrical edge sharpening.

B. Using two n-type MOSVAR at each node, as shown in FIG. 6. This way, we can have a symmetrical C(V) curve, however the capacitance of each node would be twice as large which limits the cut-off frequency of the line by a factor of 1.4. Another limitation of this method is the additional parasitic capacitance to the substrate that may lower the effective non-linearity factor, b, of the capacitors.

In a preferred embodiment, the goal is to achieve the minimum rise time while decreasing the fall time at the same time, so that a single capacitor at each node can be used. For other applications with different objectives one of the alternative methods shown above may be preferred.

The Effect of Loss

Figure 7:
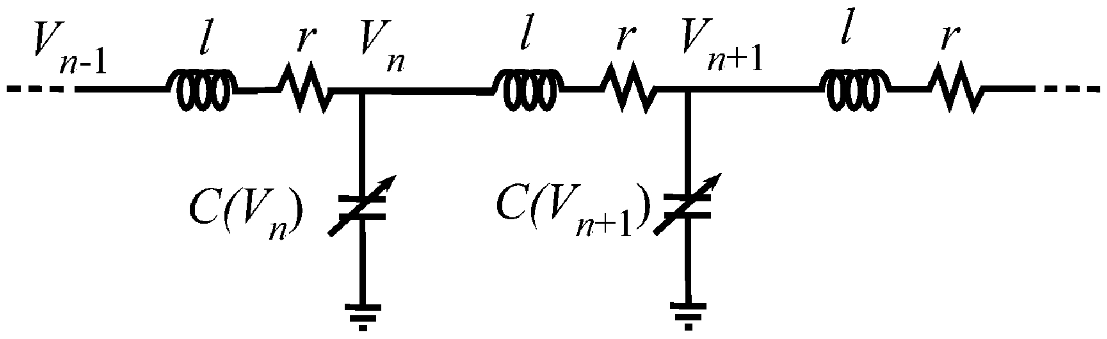
FIGS. 7 and 8 shows models of a lossy nonlinear transmission line.

FIG. 7 shows a simple model of a lossy non-linear transmission line. By applying KCL at node n, whose voltage with respect to ground is $V_n$, and applying KVL across the two branches connected to this node, as shown in [15], one can easily show that voltages of adjacent nodes on this NLTL are related via:

$$V_{n-1} - 2V_n + V_{n+1} = l\frac{d}{dt}(I_{n-1} - I_n) + r(I_{n-1} - I_n) \tag{14}$$

where r is resistance of each section.

An approximate continuous partial differential equation can be obtained similar to (2) as:

$$\frac{\partial^2 V}{\partial x^2} + \frac{\delta^2}{12}\frac{\partial^4 V}{\partial x^4} = L\frac{\partial}{\partial t}\left[\left(C(V)\frac{\partial V}{\partial t}\right)\right] + RC(V)\frac{\partial V}{\partial t} \tag{15}$$

Unfortunately, the applicants could not find an analytical solution for (15) and had to use numerical methods to solve it.

Figure 8:
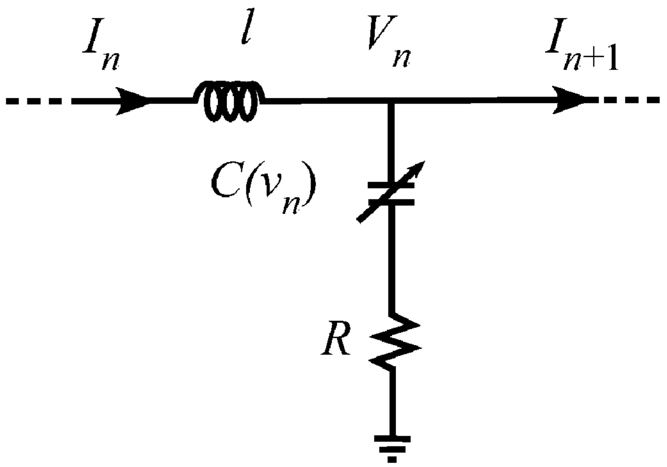

Other model for the loss of the transmission line is shown in FIG. 8. In this case one can show that the governing equation of the line is:

$$\frac{\partial^2 V}{\partial t^2} - b\frac{\partial^2 V^2}{\partial t^2} = v_0^2\left[\frac{\partial^2 V}{\partial x^2} + \frac{1}{12}\frac{\partial^4 V}{\partial x^4}\right] + \frac{R}{L}\left[\frac{\partial^2 V}{\partial x^2} - b\frac{\partial^2 V^2}{\partial x^2}\right] \tag{16}$$

which can be reduced to Burgers equation [14, 15] as shown in [15].

In both models, the numerical solution of the governing equations shows that loss has an effect similar to the dispersion, meaning that loss causes the waveform to spread out, so in order to have a soliton pulse in a lossy non-linear transmission line, non-linearity should be strong enough to cancel out both-dispersion and loss.

Gradually Scaled NLTL

Figure 10A:
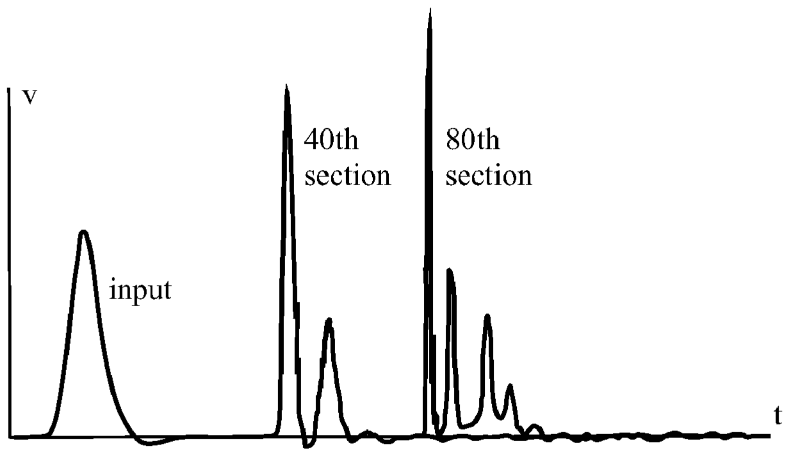
FIGS. 10A and 10B show output waveforms of normal and gradual soliton lines, respectively.
Figure 10B:
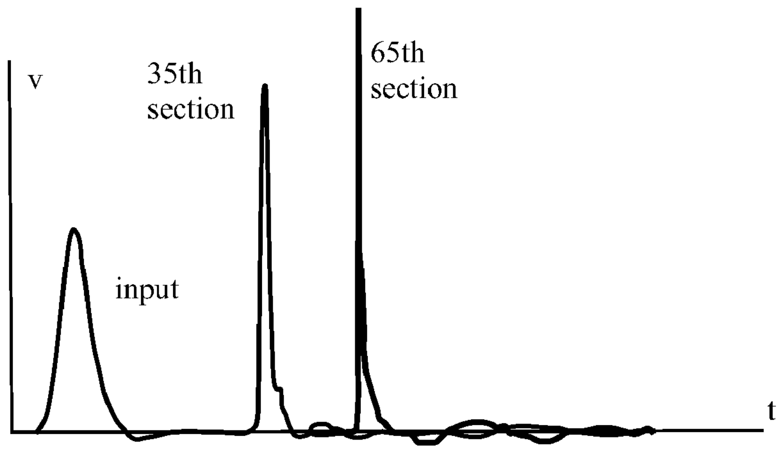

One problem in pulse narrowing NLTLs is that if the input pulse is wider than a certain minimum related to the natural pulse width of the line in (11), the line is incapable of concentrating all that energy into one pulse and instead the input pulse degenerates into multiple soliton pulses, as shown in the simulated upper waveforms of FIG. 10. This is an undesirable effect that cannot be avoided in a standard line.

Figure 9:
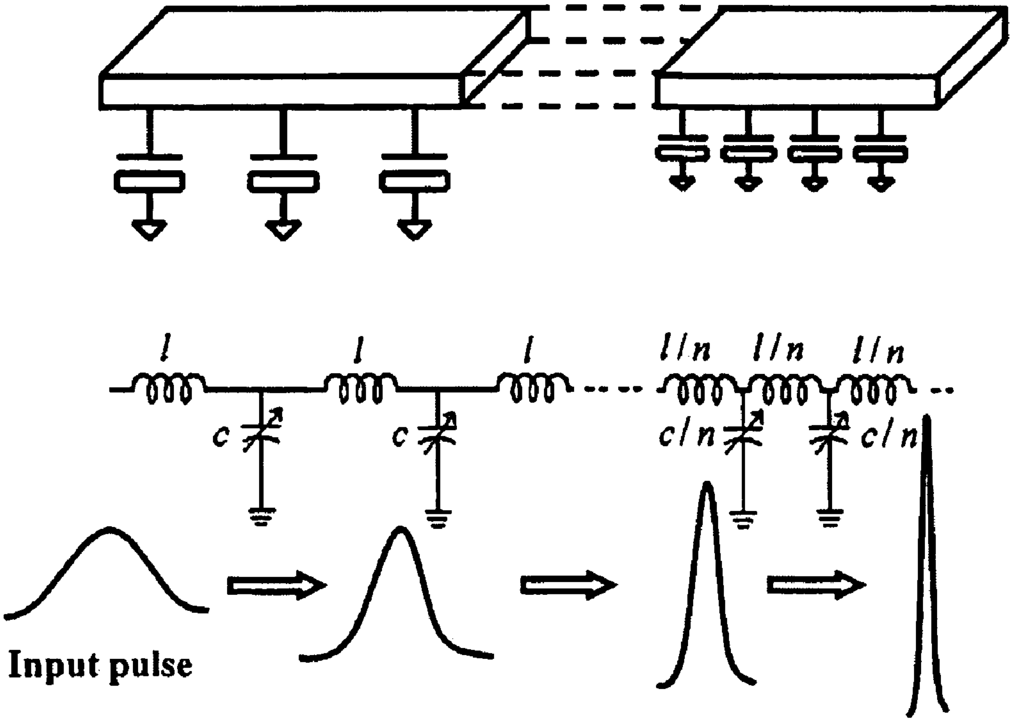
FIG. 9 shows a schematic representation of a gradually scaled nonlinear transmission line.

One can solve this problem by using gradually scaled non-linear transmission lines [9]. We notice that the characteristic pulse width of the line is controlled by the node spacing, δ, and the propagation velocity, v, which is in turn controlled by L and C. Thus, the applicants use a gradual line consisting of several segments that are gradually scaled to have smaller characteristic pulse width, as shown in FIG. 9.

The first few segments have the widest characteristic pulse, meaning that their output is wider and has smaller amplitude. As a result, the input pulse will cause just one pulse at the output of these segments. The following segments have a narrower response and the last segment has the narrowest one. This will guarantee the gradual narrowing of the pulses and avoids degeneration. Each segment should be long enough so that the pulse can reach the segment's steady-state response before entering the next segment.

One design consideration is that the characteristic impedance of each segment matches those of the adjacent segments to avoid reflections. This requires the same scaling factor for both L and C, so that their ratio remains constant. If one assumes a linear approximation for C-V curve of the voltage variable capacitors, the scaled inductors and variable capacitors could be mathematically modeled as:

$$C(x_n, V_n) = C_0(x_n)(1 - bV_n) \tag{17}$$

where $C_0(x_n) = C_0(1 - a_1 x_n)$ and, $$L(x_n) = L_0(1 - a_2 x_n) \tag{18}$$

where $L_0$ and $C_0$ represent the inductance and zero volt bias capacitance of the input stage respectively, $x_n$ is the distance from the input node, and $a_1$ and $a_2$ are tapering factor of the capacitors and inductors, respectively. Here the assumption is that each section is scaled compared to its previous one and $a_1$ and $a_2$ are rate of the scaling of capacitors and inductors, respectively. That is, a NLTL with no two adjacent sections at the same scale is provided. Now a wave equation for a gradually scaled NLTL can be written by plugging (17) and (18) into (3):

$$L(x_n)\frac{\partial}{\partial t}\left[C(x_n, V_n)\frac{\partial V_n}{\partial t}\right] = \frac{\partial^2 V_n}{\partial x^2} + \frac{1}{12}\delta^2\frac{\partial^4 V_n}{\partial x^4} \quad (19)$$

$$L_0(1-a_2x_n)\frac{\partial}{\partial t}\left[C_0(1-a_1x_n)(1-bV_n)\frac{\partial V_n}{\partial t}\right] = \frac{\partial^2 V_n}{\partial x^2} + \frac{1}{12}\delta^2\frac{\partial^4 V_n}{\partial x^4} \quad (20)$$

assuming $a_1L<<1$ and $a_2L<<1$, where L is the length of the line, one can simplify the above equation to:

$$\frac{\partial^2 V}{\partial t^2} - \frac{1}{L_0C_0(1-(a_1+a_2)x)}\frac{\partial^2 V}{\partial x^2} = \frac{\delta^2}{12}\frac{1}{L_0C_0(1-(a_1+a_2)x)}\frac{\partial^4 V}{\partial x^4} + \frac{b}{2}\frac{\partial^2 V^2}{\partial t^2} \quad (21)$$

Numerical methods can be used to solve the PDE in (21). Under the assumption that $(a_1+a_2)L<<1$, one can approximate (21) and obtain the width of the pulse as $$W = \left(1 - \frac{2bV_{max}}{3}\right)\sqrt{\frac{3L_0C_0(1-kx)}{2bV_{max}}} \quad (22)$$

Based on (22), as a pulse travels along the line (x increases), its width will decrease. The waveforms of this gradually scaled NLTL are shown in the lower part of FIG. 10, demonstrating the effectiveness of this technique. It is noteworthy that this gradually scaling technique is also applicable to the edge sharpening lines and does improve their performance, too.

A more complete analysis can be found in [22], which is incorporated herein by reference in its entirety.

Simulation

The applicants have designed one edge sharpening and two pulse narrowing NLTLs with different tapering factors ($a_1$ and $a_2$) using the accumulation-mode MOS varactors and metal micro-strip transmission lines in a 0.18 μm BiCMOS process. FIG. 11 shows the measured characteristic of the accumulation-mode MOSVAR used in this design. All the capacitors have similar C-V characteristics; however, the applicants used different capacitances along the line in order to build a gradually scaled NLTL.

To achieve the lowest pulse width in the pulse narrowing lines or the shortest rise and fall times in the edge sharpening line, it is preferable to carefully select the dc level and the voltage swing. In general, this may be an additional constraint in system design since it will require additional dc level shifting and amplification or attenuation to adjust the input levels. Nonetheless, this level of signal conditioning is easily achieved in today's integrated circuits. The dc level and the voltage swing for each application is mentioned in the following sections.

All three lines comprise one hundred capacitors and one hundred inductors. The applicants simulated the passive transmission lines in Sonnet [17] and the complete NLTL in ADS [18]. Next, the details specific to each kind of lines will be discussed separately.

A. Pulse Narrowing Lines

For pulse narrowing lines, one would like to have the maximum change in the capacitance with voltage. Thus, we chose the baseline dc bias point at 0.8V which corresponds to the maximum capacitance point, and applied negative input pulses from this dc level. For a typical pulse amplitude of 1 Volt, the effective non-linearity factor b in (12) is around 0.5 $V^{-1}$. As explained in the Section 'Gradually Scaled NLTL', the lines are not continuously scaled, but comprise several segments with constant values of inductors and capacitors within a segment. A continuous scaling of the line is preferable because of internal reflections between different segments of the line due to mismatch. The inductances and capacitances within each segment are lower than those of the previous segment. One of the lines comprises three different segments and the other four.

The embodiments presented in this subsection and the section 'Experimental Results' are those associated with the four-segment line which has a smaller pulse width. The lines are designed in such a way that the characteristic pulse width of each segment (given by (11)) is half that of the previous segment so the line can at least compress the input pulse by a factor of sixteen without degenerating into multiple pulses.

Figure 12:
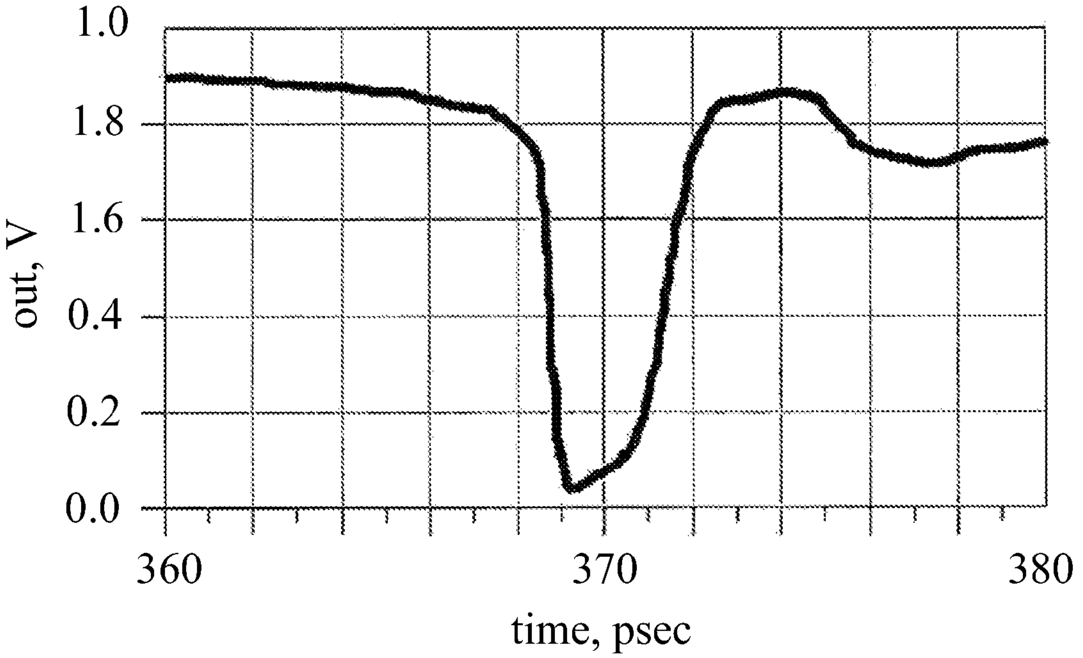
FIG. 12 shows a simulated output waveform of a pulse narrowing line.

The simulated output waveform of the line to a 65 ps wide input pulse is shown in FIG. 12. The simulation predicts that this silicon-based NLTL can produce negative pulses as narrow as 2.5 ps (half amplitude width) with a 0.8V amplitude at the output. It is noteworthy that transistors in this process are incapable of producing pulses nearly as narrow as those generated by the NLTL.

B. Edge Sharpening Lines

Figure 13:
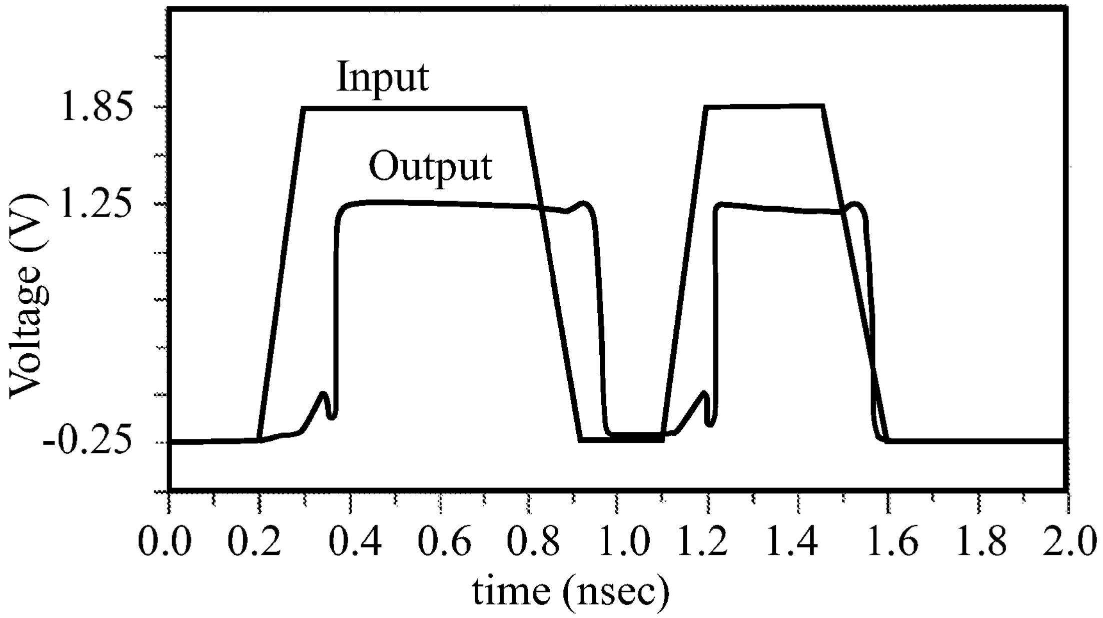
FIG. 13 shows simulated input and output waveforms of the edge sharpening line.

As shown in the 'Edge Sharpening Lines' Section, to build an edge sharpening line advantage should be taken of the non monotonic C-V behavior exemplified by the secondary reduction in the capacitance, as shown in FIG. 11. Computer simulations show the best bias point and voltage swing are around −0.25V and 2V at the input, respectively. Although these levels led to the best achievable improvement in the rise and fall times, the line still enhances the rising and falling edges for input signal voltage swings between 1.5V and 2V. FIG. 13 shows the simulated input and output waveforms of this line.

The output pulses exhibit reduced rise and fall times of 1.5 ps and 20 ps, respectively. The rise and fall times of the output pulses are different because of the asymmetrical behavior of the non-linear element for two different edges. The applicants have also simulated this line with a pseudo-random data source and verified its edge sharpening functionality for any arbitrary data sequence. There seems to be some data dependant delay due to the non-linear behavior of the lines in the simulations, see FIG. 13. This could have some implications for the data dependant jitter in the lines.

Unfortunately in this line, one cannot fully control the characteristic impedance of the lines because the lowest capacitance and inductance have to be picked—limited by the parasitic elements—to obtain that maximum improvement in the rise and fall times. This will allow maximization of the cut-off frequency of the line. However, it is not possible to build very small non linear capacitors, because if we shrink the size of the accumulation-mode MOSVARs the effect of the parasitic capacitors becomes more important. These parasitic capacitors are voltage independent, hence linear, and will result in an effective reduction of the non linearity factor, b, in (12). In this design, the effective input impedance of the edge sharpening line is around 20Ω gradually scales to 50Ω at the output. So the input reflection coefficient of the line is roughly 0.4. This effect should be taken into account to be able to match the simulation and the measurement results.

Experimental Results

Figure 14:
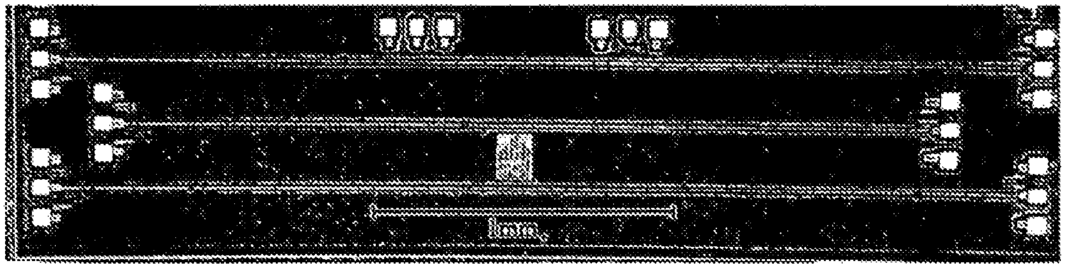
FIG. 14 shows a chip microphotograph: the middle line is an edge sharpening line and the other two are pulse narrowing lines.

All three lines were fabricated in a 0.18 μm BiCMOS technology. FIG. 14 shows a chip micro photograph. RF probes are used to apply input to the line and to measure its output waveform. A 50 GHz sampling oscilloscope is used to measure the input and output waveforms. A k-connector system of probes, connectors, and cables with a bandwidth of approximately 40 GHz is used to bring the data to the oscilloscope. The main challenge in this measurement is the low bandwidth of the measurement system compared to the signal bandwidth, so it is essential to characterize the measurement setup carefully.

Figure 15:
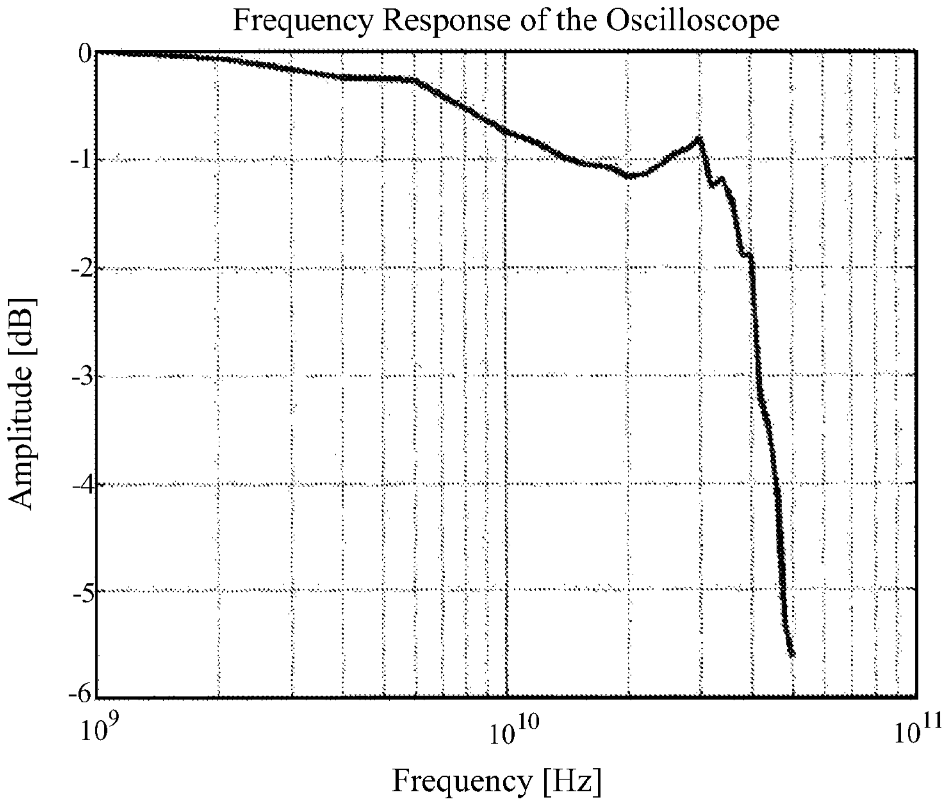
FIGS. 15 and 16 shows an oscilloscope response, and a cable/connectors/probes response, respectively.
Figure 16:
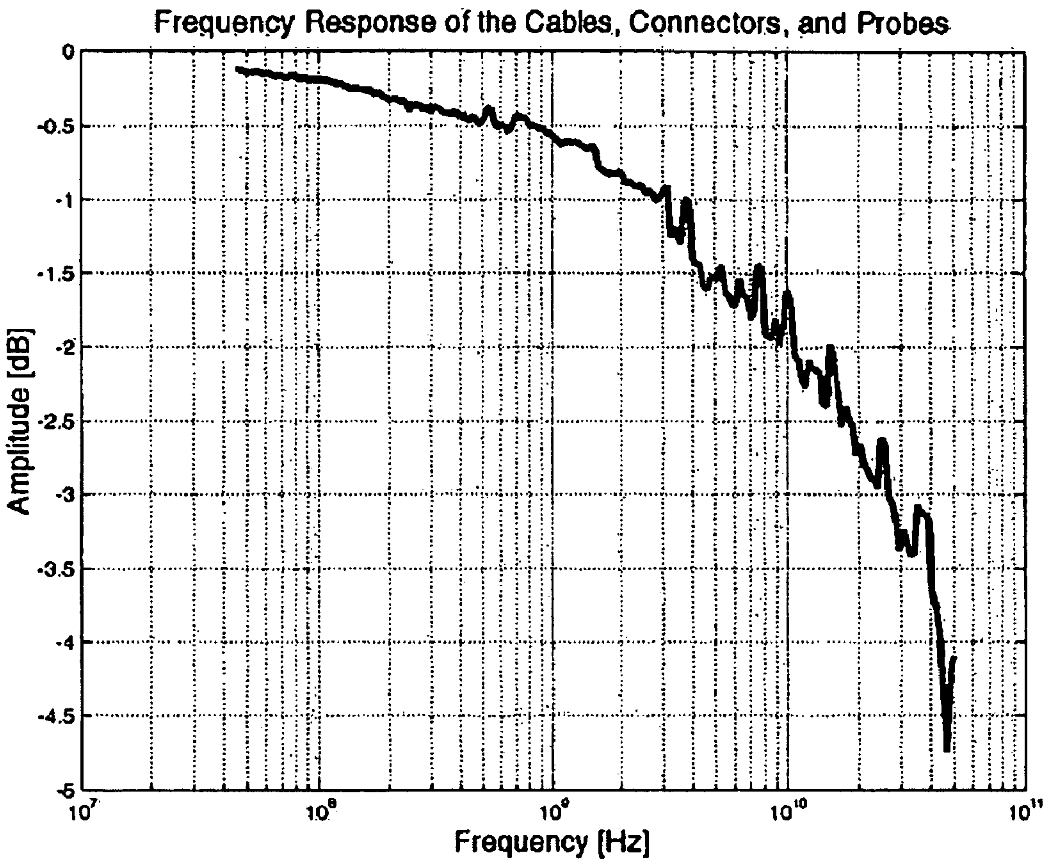

First the oscilloscope was characterized using a signal source. Applicants swept the source frequency and measured the amplitude of the signal on the oscilloscope; then using the same signal source, cables, and connectors, we measured the signal amplitude using a wideband power meter. The ratio of these two values is the amplitude response of the oscilloscope. FIG. 15 shows this response. Then we characterize all other cables, connectors, probes, and bias tees using a 50 GHz network analyzer. The response of these parts is shown in FIG. 16. The amplitude response of the entire measurement setup is the product of FIG. 15 and FIG. 16. Using Matlab [19], one can show that the 10%-to-90% rise-time of such system is around 10.5 ps, which indicates that it is not possible to resolve rise times lower than 10.5 ps and pulse widths lower than 21 ps.

Figure 17:
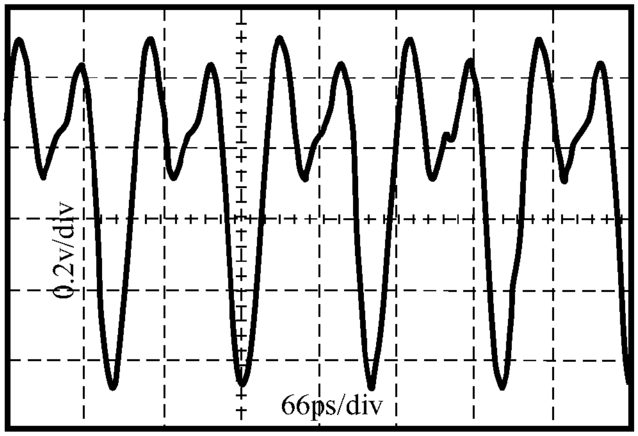
FIG. 17 shows input and output of a pulse narrowing line.

FIG. 17 shows the measured response of the pulse narrowing line to a 50 ps input pulse. Based on response of the measurement setup (FIG. 15 and FIG. 16), the response of the measurement setup to a 2.5 ps pulse is 21.5 ps wide. The measured pulse width is 22 ps, which is in good agreement with the simulation.

Figure 18:
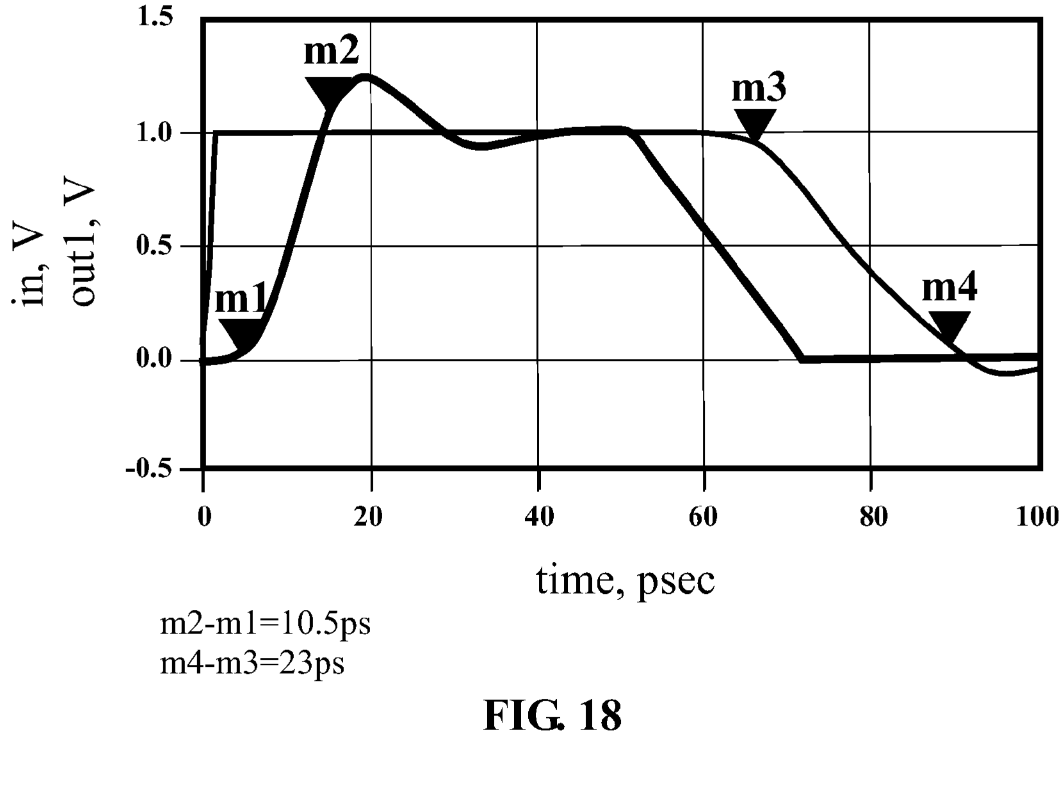
FIG. 18 shows the response of the measurement setup to an ideal input.
Figure 19B:
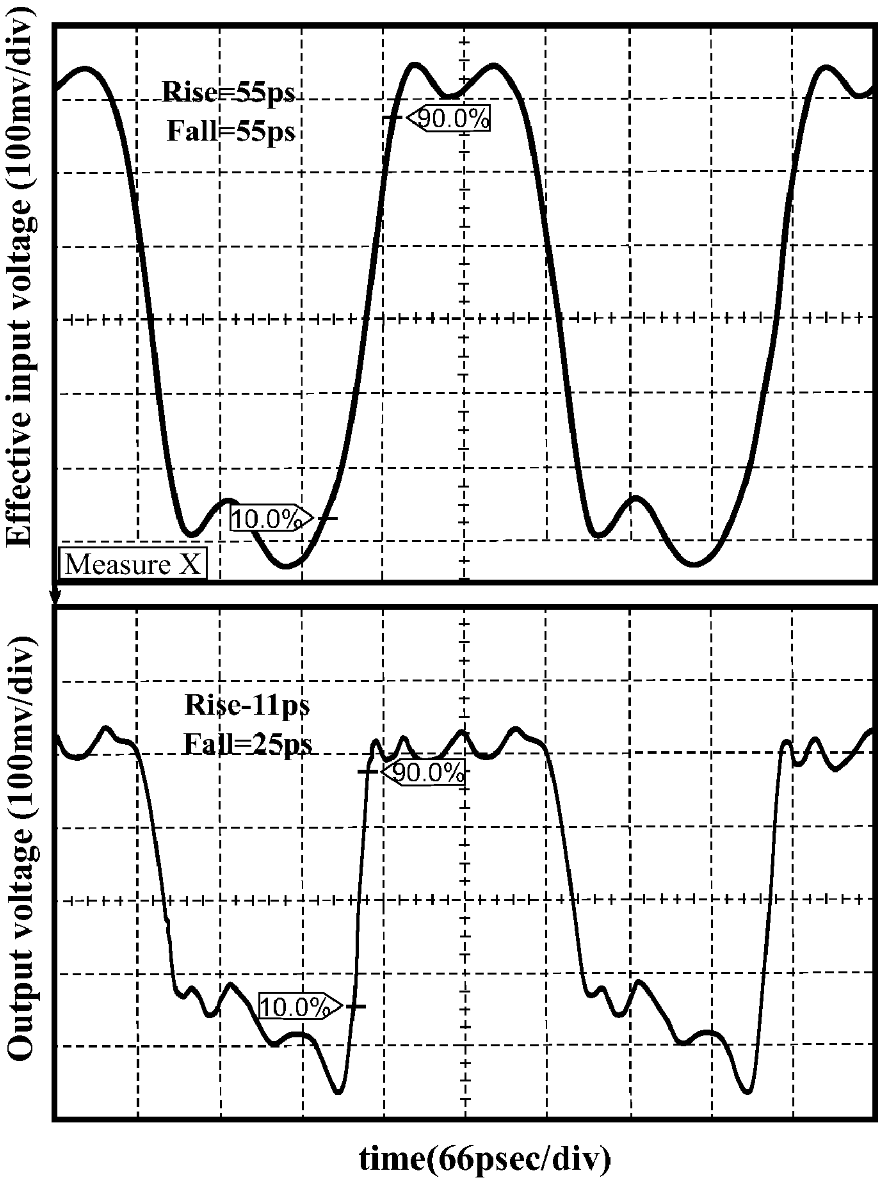
Figure 20:
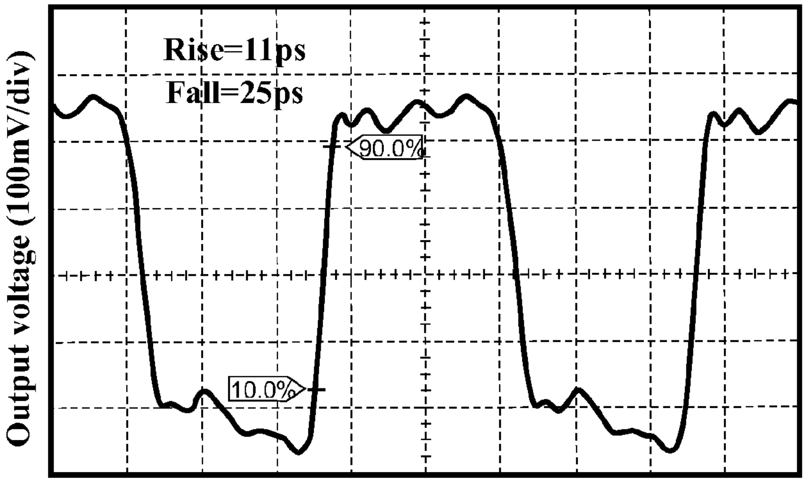
FIG. 20 shows output waveforms of an edge sharpening line with a different amplitude.

Matlab simulations show that if we have an ideal pulse with rise and fall times of 1.5 ps and 20 ps, one should expect rise and fall times of 10.5 ps and 23 ps, respectively with this measurement setup, as it is shown in FIG. 18. The measured rise and fall times for this line are 11 ps and 25 ps, as shown in FIG. 19. Also it is important to note that the rise and fall times do not change with the input amplitude, as shown in FIG. 20, which verifies the non-linear behavior of the line.

In the end, it is important to notice that we can set an upper bound for the pulse width of output pulses of our pulse narrowing line and rise and fall times of our edge sharpening line instead of measuring the exact values. To be accurate, we should import the frequency response of measurement system and our measured pulse width and rise/fall times to a computer simulator (like Matlab) and find out the upper limit of these parameters. In this case, computer simulations shows that the pulse width of output of pulse narrowing line and rise time of output pulse of edge sharpening line are less than 8 ps and fall time of output pulse of edge sharpening line is around 23 ps.

Wideband Power Combiner

Figure 21:
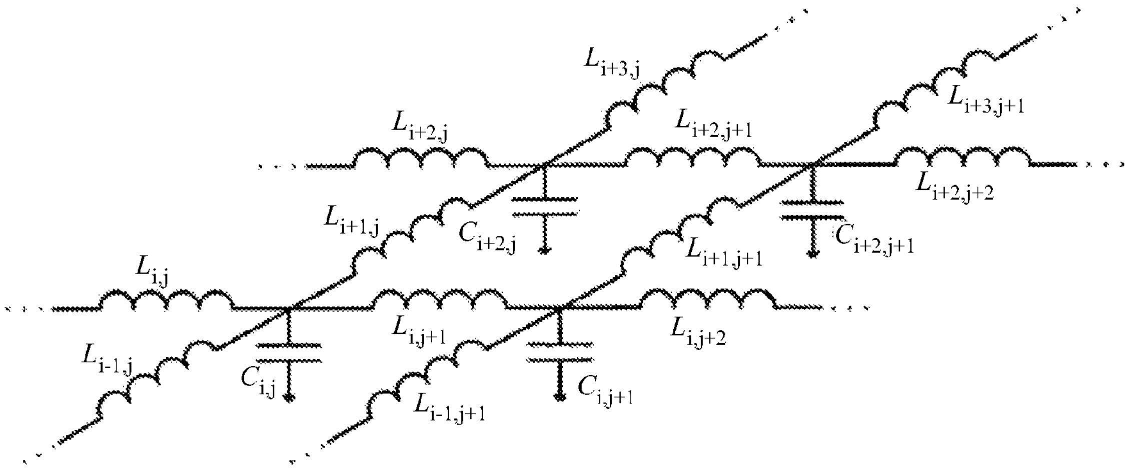
FIG. 21 shows a 2D square electrical lattice.

A 1-D LC ladder can be generalized to a 2-D propagation medium by forming a lattice comprising inductors (L) and capacitors (C). FIG. 21 shows a square lattice. Generally, this lattice can be inhomogeneous where the L's and C's vary in space or nonlinear where they are current and/or voltage dependent. When the L's and C's do not change too abruptly, it is possible to define local propagation delay ($\propto\sqrt{LC}$) and local characteristic impedances ($\propto\sqrt{L/C}$) at each node. This allows definition of local impedance and velocity as functions of x and y, which can be engineered to achieve the desired propagation and reflection properties [22]. In this application, applicants show one application of these 2-D lattices as a means for simultaneous power combining and impedance transformation.

Figure 22:
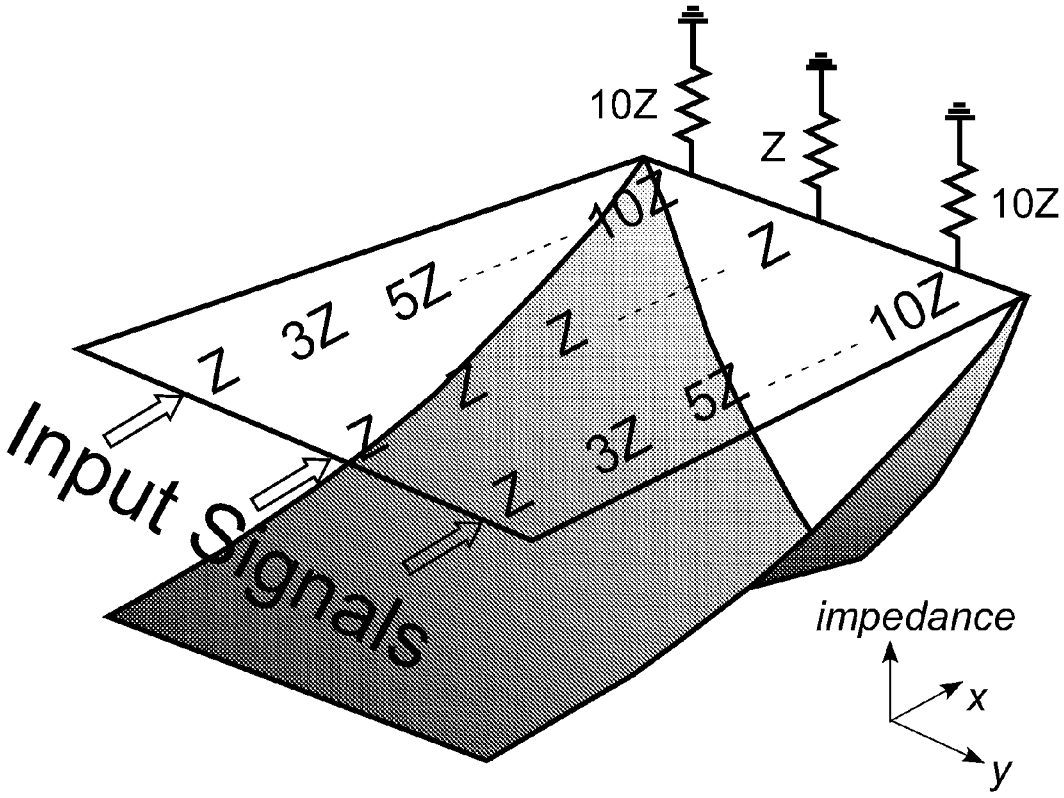
FIG. 22 shows a basic idea of a funnel.

One way these surfaces can be engineered is by keeping the propagation velocity constant vertically (constant LC product for a given y), while increasing the characteristic impedance at the top and bottom of the lattice at a faster rate as we move along the x axis to the right, as illustrated in FIG. 22. A planar wave propagating in the x direction from left to right gradually experiences higher impedances at the edges, creating a lower resistance path for the current in the middle; this funnels more power to the center as the wave propagates to the right, while we can perform a gradual impedance transformation from the left to the right. This is shown in the simulated voltage and current waveforms of FIG. 23. By keeping the propagation velocity independent of y as we move along the x axis, one can maintain a plane wave keeping the lattice response frequency independent for the frequencies lower than its natural cut-off frequency [22]. Applicants call this an electrical funnel due to the way it combines and channels the power to the center at the output.

Multiple synchronous signal sources driving the low-impedance left-hand side of the funnel can generate a planar wave-front moving along the x axis. The output node is at the center of the right boundary. The entire right boundary nodes are terminated with a resistor matched to the local impedance at that node. The up and down boundaries are kept open. FIG. 23 shows simulated efficiency of one implementation vs. frequency demonstrating the broadband nature of the electrical funnel. Efficiency is defined by the ratio of the power at the output node to the sum of powers of inputs.

In practice, the characteristic impedance at the edges of the rectangular implementation keeps increasing and hence it is possible to discard the higher impedance parts of the mesh as we move to the right, effectively reducing it to a trapezoid. In a silicon process with multiple metals, we can use different metal layers as the ground plane at different points on the y axis. Our design uses four lower metal layers to form the variable depth ground plane. This leads to different capacitance per unit length that can be used to control the local characteristic impedance across the combiner, as shown in FIG. 24. Since this does not change the inductance, the propagation delay is not constant vs. y, resulting in a band-pass response. The output is matched to 50Ω while each of the inputs is matched to around 15Ω. The difference between this structure and a standard tapered transmission line is a larger bandwidth (45% increase in this case) over a shorter distance (lower loss) due to the variable-depth ground plane. This has reduced the combiner's dimension to 410 μm by 240 μm.

Figure 25:
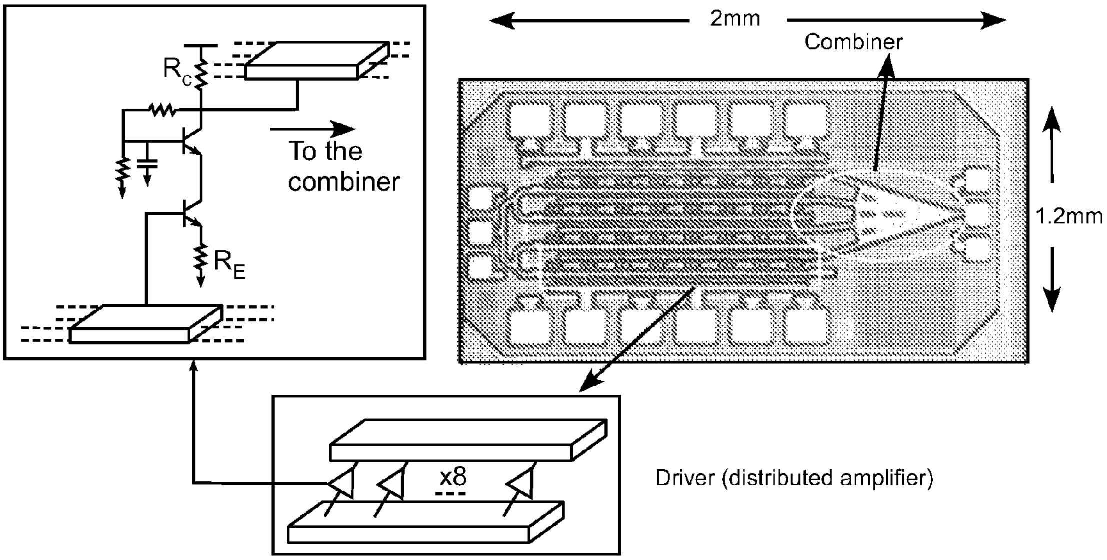
FIG. 25 shows a microphotograph of a combiner on chip.

The applicants used this combiner to design a power amplifier in a 0.13 μm SiGe BiCMOS with a bipolar cutoff frequency of 200 GHz. Die photo of the amplifier is shown in FIG. 25. In order to obtain a wideband response, the applicants used degenerate cascode distributed amplifiers with emitter degeneration as input drivers. A non-degenerate cascode amplifying stage in this process has a maximum stable power gain of 15 dB at 80 GHz, as opposed to 7 dB for a standard common-emitter. The cascode stages are emitter degenerated to improve bandwidth and avoid thermal runaway. Each of the four distributed amplifiers consists of eight cascode stages driving the output transmission line, which drive the inputs of the combiner.

Figure 26:
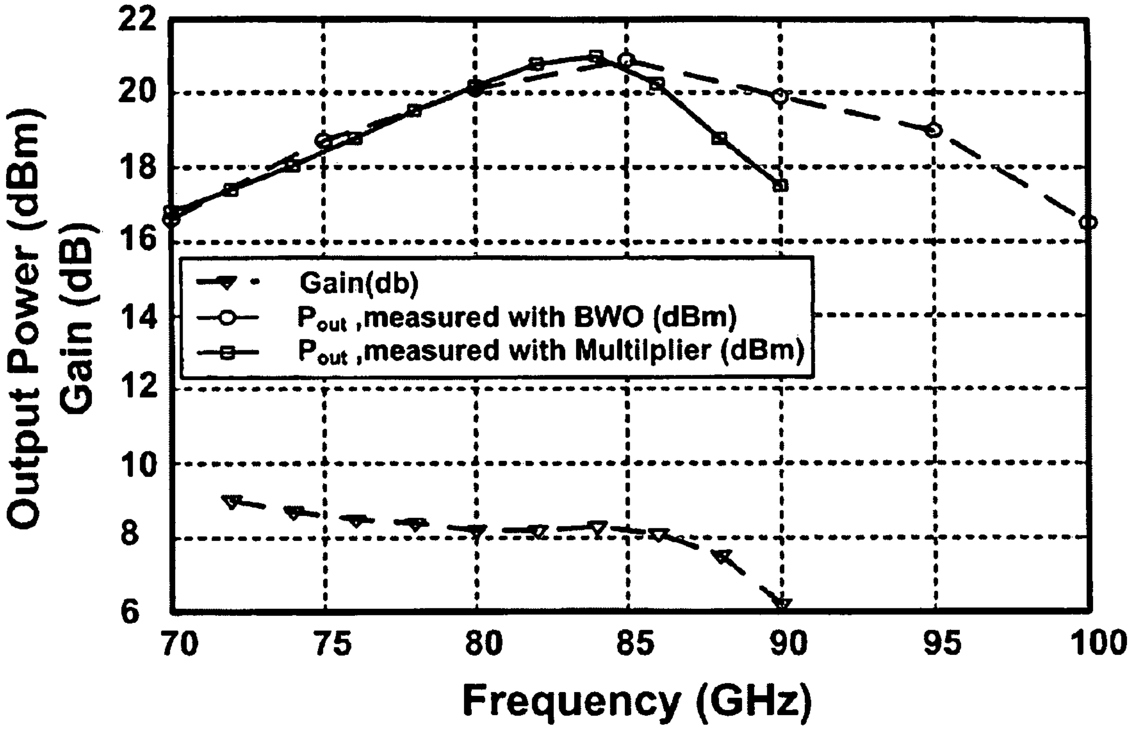
FIG. 26 is a diagram showing measured saturated power and gain vs. frequency.
Figure 27:
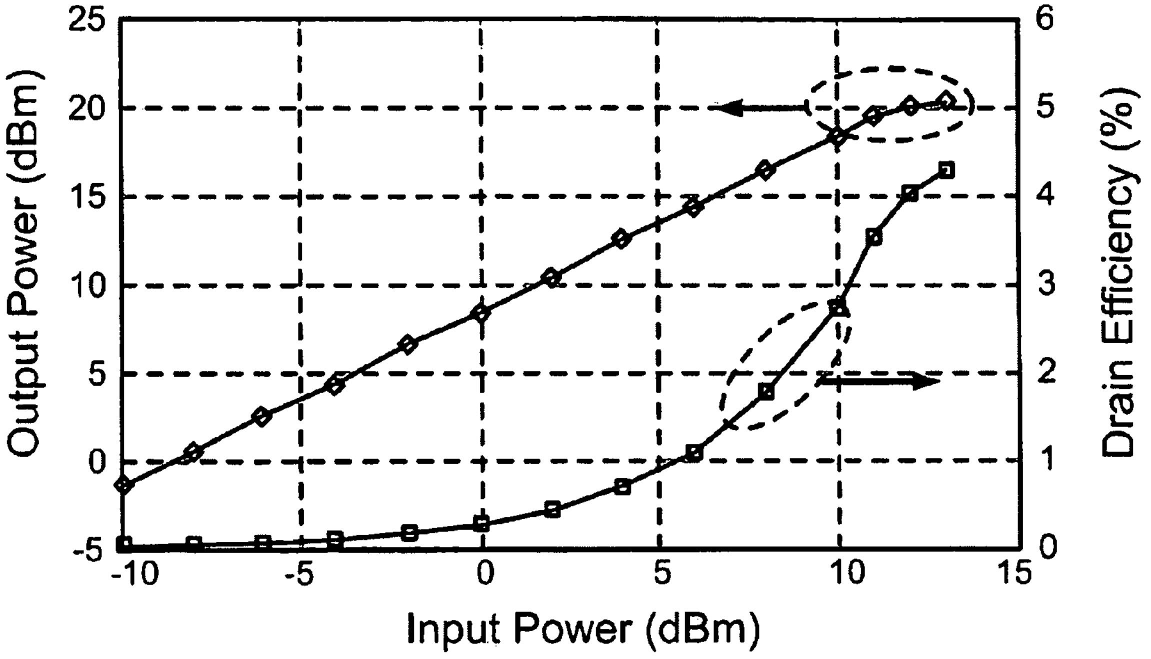
FIG. 27 is a diagram showing measured large-signal parameters of an amplifier at 85 GHz.

The driver amplifiers have two power supplies of −2.5V and 0.8V and draws 750 mA of current. FIG. 26 shows the measured peak output power and gain of the amplifier vs. frequency. The maximum output power was measured using two different signal sources: a backward wave oscillator (BWO) and a frequency multiplier. The overall small-signal gain is above 8 dB at 85 GHz where the peak power of 125 mW is achieved. The lower measured maximum power in the multiplier measurement is due to its limited output power compared to BWO and the lower amplifier gain above 86 GHz. The output power and drain efficiency as a function of input power are shown in FIG. 27. At 85 GHz, drain efficiency is more than 4% at 3 dB gain compression. The amplifier has a 3 dB power bandwidth of 24 GHz (between 73 GHz and 97 GHz).

Wideband Upconversion+Power Combining

Figure 28:
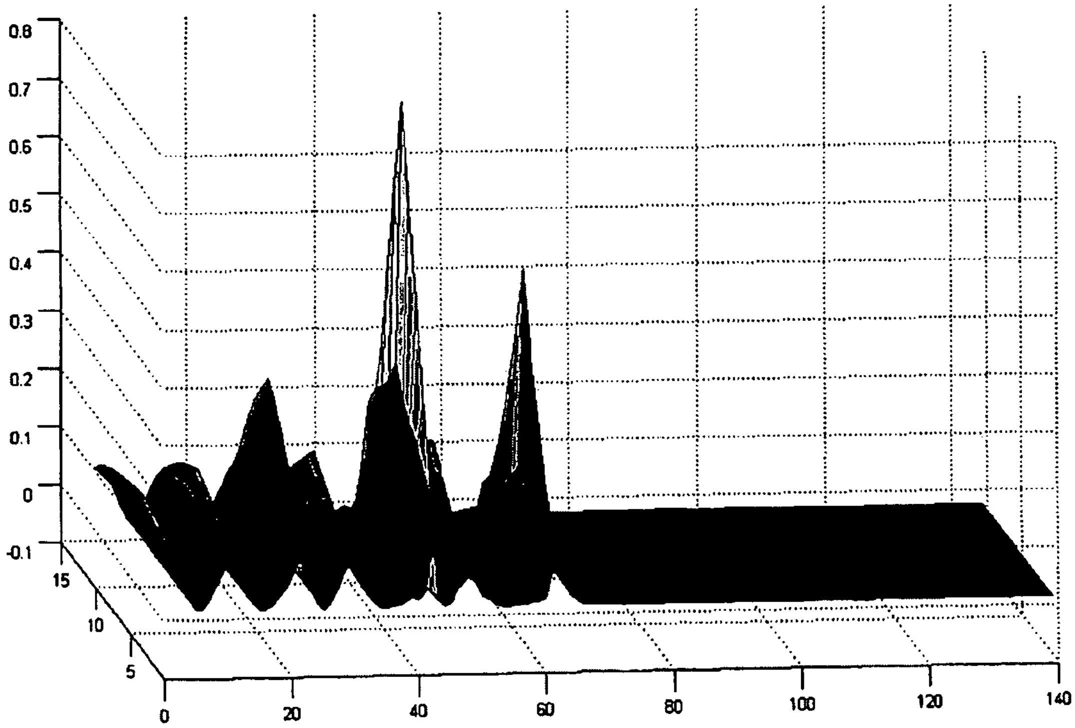
FIG. 28 is a diagram showing power as a function of position for a 2D non-uniform lattice showing both funneling effect and increasing of frequency content.

At the described funnel, the constant capacitors could be replaced with voltage dependent ones. By doing this, the input power could be focused and at the same time, its frequency content increased. FIG. 28 shows the simulated instantaneous power at this lattice showing these two effects.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

LIST OF REFERENCES CITED

[1] J. S. Russell, "Report on Waves," *Report of the fourteenth meeting of the British Association for the Advancement of Science*, pp. 311-90, Plates XLVII-LVII, York, September 1844 (London, 1845).

[2] P. G. Drazin, and R. S. Johnson, *Solitons*, Cambridge University Press, Cambridge, 1989.

[3] M. J. Ablowitz and H. Segur, *Solitons and the Inverse Scattering Transform*, Society for Industrial and Applied Mathematics, 1981.

[4] J. R. Tailor, *Optical Solitons—Theory and Experiment*, Cambridge University Press, Cambridge, 1992.

[5] R. K. Bullough and P. J. Caudrey, *Solitons*, Springer-Verlag, Berlin, 1980.

[6] E. Infeld, and G. Rowlands, *Nonlinear Waves, Solitons and Chaos*, Cambridge University Press, Cambridge, 1990.

[7] P. J. Olver and D. H. Sattinger, *Solitons in Physics, Mathematics, and Nonlinear Optics*, Springer-Verlag, New York, 1990.

[8] M. Remoissenet, *Waves called Solitons: Concepts and Experiments*, Springer-Verlag, Berlin, 1994.

[9] M. G. Case, *Nonlinear Transmission lines for Picosecond Pulse, Impulse and Millimeter-Wave Harmonic Generation*, Ph.D. dissertation, University of California Santa Barbara, July 1993.

[10] Mark J. W. Rodwell, Masayuki Kamegawa, Ruai Yu, Michael Case, Eric Carman, and Kirk Giboney, "GaAs Nonlinear Transmission Lines for Picosecond Pulse Generation and Millimeter-Wave Sampling," *IEEE Transactions on Microwave Theory and Techniques*, vol. 39, no. 7, pp. 1194-1204, July 1991.

[11] E. Kameda, T. Matsuda, Y. Emura, and T. Ohzone, "Study of the Current-Voltage Characteristics in MOS Capacitors with Si-Implanted Gate Oxide," *Solid-State Electronics*, vol. 43, no. 3, pp. 555-63, March 1999.

[12] S. Matsumoto, K. Hisamitsu, M. Tanaka, H. Ueno, M. Miura-Mattausch, Mattausch H, et al. "Validity of Mobility Universality for Scaled Metal-Oxide-Semiconductor Field-Effect Transistors Down to 100 nm Gate Length," *Journal of Applied Physics*, vol. 92, no. 9, pp. 5228-32, November 2002.

[13] L. Larcher, P. Pavan, F. Pellizzer, G. Ghidini, "A New Model of Gate Capacitance as a Simple Tool to Extract MOS Parameters," *IEEE Transactions on Electron Devices*, vol. 48, no. 5, pp. 93545, May 2001.

[14] E. R. Benton and G. W. Platzman, "A Table of Solutions of the of the One-Dimensional Burgers Equation", Quart. *Appl. Math.*, 195-212, July 1972.

[15] E. Afshari, "Solitonic Pulse Shaping", Caltech Internal report.

[16] R. A. Scholtz, "Signal Selection for the Indoor Wireless Impulse Radio Channel," *Proceedings IEEE VTC conference*, May 1997.

[17] SONNET Software, High frequency electromagnetic software [Online]. Available: http://www.sonnetusa.com/

[18] Advanced Design System User Guide, Agilent.

[19] Matlab User Guide, MathWorks. Available: http://www.mathworks.com/

[20] U. R. Pfeiffer, et al., "A 77 GHz SiGe Power Amplifier for Potential Applications in Automotive Radar Systems," RFIC, pp. 91-4, June 2004.

[21] I. Aoki, et al., "Distributed Active Transformer: A New Power Combining and Impedance Transformation Techniques," IEEE MTT, pp. 316-332, January 2002.

[22] E. Afshari, et al., "Extremely Wideband Signal Shaping using one- and two Dimensional Non-uniform Nonlinear Transmission Lines," *Journal of Applied Physics*, vol. 99, no. 5, March 2006.

What is claimed is:

1. A method for generating a planar wave front, comprising:

providing a two-dimensional transmission line comprising inductors and capacitors, said two-dimensional transmission line having a delay and a characteristic impedance;

keeping constant one between the delay and the characteristic impedance and varying the other between the delay and the characteristic impedance; and inputting a plurality of signal sources to the two-dimensional transmission line.

2. The method of claim 1, wherein said keeping constant occurs along a first dimension of the two-dimensional transmission line and said varying occurs along a second dimension of the two-dimensional transmission line.

3. The method of claim 1, wherein the two-dimensional transmission line is a inhomogeneous two-dimensional transmission line.

4. The method of claim 1, wherein the two-dimensional transmission line is a nonlinear two-dimensional transmission line.

5. The method of claim 1, wherein the inductors are selected between constant, current dependent, and voltage dependent inductors, and the capacitors are selected between constant, current dependent, and voltage dependent capacitors.

* * * * *